United States Patent
Ko et al.

(10) Patent No.: US 7,569,896 B2
(45) Date of Patent: Aug. 4, 2009

(54) TRANSISTORS WITH STRESSED CHANNELS

(75) Inventors: Chih-Hsin Ko, Fongshan (TW); Chung-Hu Ke, Taipei (TW); Hung-Wei Chen, Hsinchu (TW); Wen-Chin Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 340 days.

(21) Appl. No.: 11/438,711

(22) Filed: May 22, 2006

(65) Prior Publication Data

US 2007/0267694 A1 Nov. 22, 2007

(51) Int. Cl.
*H01L 29/78* (2006.01)
(52) U.S. Cl. ................ 257/382; 257/623; 257/E29.122
(58) Field of Classification Search ................ 257/382, 257/623, E29.022, E29.122
See application file for complete search history.

(56) References Cited

U.S. PATENT DOCUMENTS

| | | | |
|---|---|---|---|
| 4,788,160 A | 11/1988 | Havemann et al. | |
| 5,516,711 A | 5/1996 | Wang | |
| 5,972,762 A | 10/1999 | Wu | |
| 5,998,839 A | 12/1999 | Cho | |
| 6,017,801 A | 1/2000 | Youn | |
| 6,165,880 A | 12/2000 | Yaung et al. | |
| 6,191,462 B1 | 2/2001 | Chen-Hua | |
| 6,207,519 B1 | 3/2001 | Kim et al. | |
| 6,329,257 B1 | 12/2001 | Luning et al. | |
| 6,368,926 B1 | 4/2002 | Wu | |
| 6,498,067 B1 | 12/2002 | Perng et al. | |
| 6,642,122 B1 | 11/2003 | Yu | |
| 6,747,373 B1 | 6/2004 | Hu et al. | |
| 6,870,179 B2 | 3/2005 | Shaheed et al. | |
| 6,911,376 B2 | 6/2005 | Yoo | |
| 6,914,309 B2 | 7/2005 | Koga | |
| 7,253,481 B2 * | 8/2007 | Wang et al. ................ | 257/382 |
| 7,361,973 B2 * | 4/2008 | Chidambarrao et al. ..... | 257/623 |
| 2002/0048898 A1 | 4/2002 | Li | |

(Continued)

OTHER PUBLICATIONS

Ge, C.-H., et al., "Process-Strained Si (PSS) CMOS Technology Featuring 3D Strain Engineering," IEDM, IEEE, 2003, pp. 73-76.

(Continued)

*Primary Examiner*—Jerome Jackson, Jr.
*Assistant Examiner*—Paul A Budd
(74) *Attorney, Agent, or Firm*—Slater & Matsil, L.L.P.

(57) ABSTRACT

A MOS device having optimized stress in the channel region and a method for forming the same are provided. The MOS device includes a gate over a substrate, a gate spacer on a sidewall of the gate wherein a non-silicide region exists under the gate spacer, a source/drain region comprising a recess in the substrate, and a silicide region on the source/drain region. A step height is formed between a higher portion of the silicide region and a lower portion of the silicide region. The recess is spaced apart from a respective edge of a non-silicide region by a spacing. The step height and the spacing preferably have a ratio of less than or equal to about 3. The width of the non-silicide region and the step height preferably have a ratio of less than or equal to about 3. The MOS device is preferably an NMOS device.

14 Claims, 8 Drawing Sheets

U.S. PATENT DOCUMENTS

2003/0073270 A1   4/2003   Hisada et al.
2004/0063289 A1   4/2004   Ohta
2005/0258515 A1   11/2005  Chidambarrao et al.
2006/0131648 A1*  6/2006   Ahn et al. .................. 257/347
2006/0220113 A1*  10/2006  Tamura et al. .............. 257/335
2006/0231826 A1   10/2006  Kohyama

OTHER PUBLICATIONS

Thompson, S. E., et al., "A 90-nm Logic Technology Featuring Strained-Silicon," IEEE Transactions on Electron Devices, vol. 51, No. 11, Nov. 2004, pp. 1790-1797.

Thompson, S., et al., "MOS Scaling: Transistor Challenges for the 21st Century," Intel Technology Journal Q3'09, pp. 1-19.

* cited by examiner

FIG. 13B

TRANSISTORS WITH STRESSED CHANNELS

CROSS-REFERENCE TO RELATED APPLICATION

This application is related to commonly assigned U.S. patent application Ser. No. 11/181,521, filed Jul. 14, 2005, entitled "High Performance MOS Device with Graded Silicide," which patent application is incorporated herein by reference.

TECHNICAL FIELD

This invention generally relates to semiconductor devices and fabrication processes, and more particularly to metal-oxide-semiconductor (MOS) devices having stressed channel regions.

BACKGROUND

The scaling of VLSI circuits is a constant effort. With circuits becoming smaller and faster, device drive current improvement becomes more important. Among efforts being made to improve device drive current, forming a stressed silicon channel, thus enhancing carrier mobility, is a known practice. Stress, sometimes referred to as strain, can enhance electron and hole mobility. The performance of a MOS device can be enhanced through a stressed-surface channel. This technique allows performance to be improved at a constant gate length, without adding complexity to circuit fabrication or design.

Stress can be induced by forming a stressed contact etch stop (CES) layer on a MOS device. When a CES layer is deposited, because of the difference in bonding energy between the CES layer and the underlying layer, an in-plane stress develops to achieve energy conservation for the composite layer, the CES layer and the underlying layer. In the channel region, stress also develops as a response to the stress applied, and the carrier mobility is enhanced. Stress applied to the channel region is determined by the intrinsic stress in the CES layer and its thickness, and the intrinsic stress generally increases when the thickness of the CES layer increases.

Figure 1:
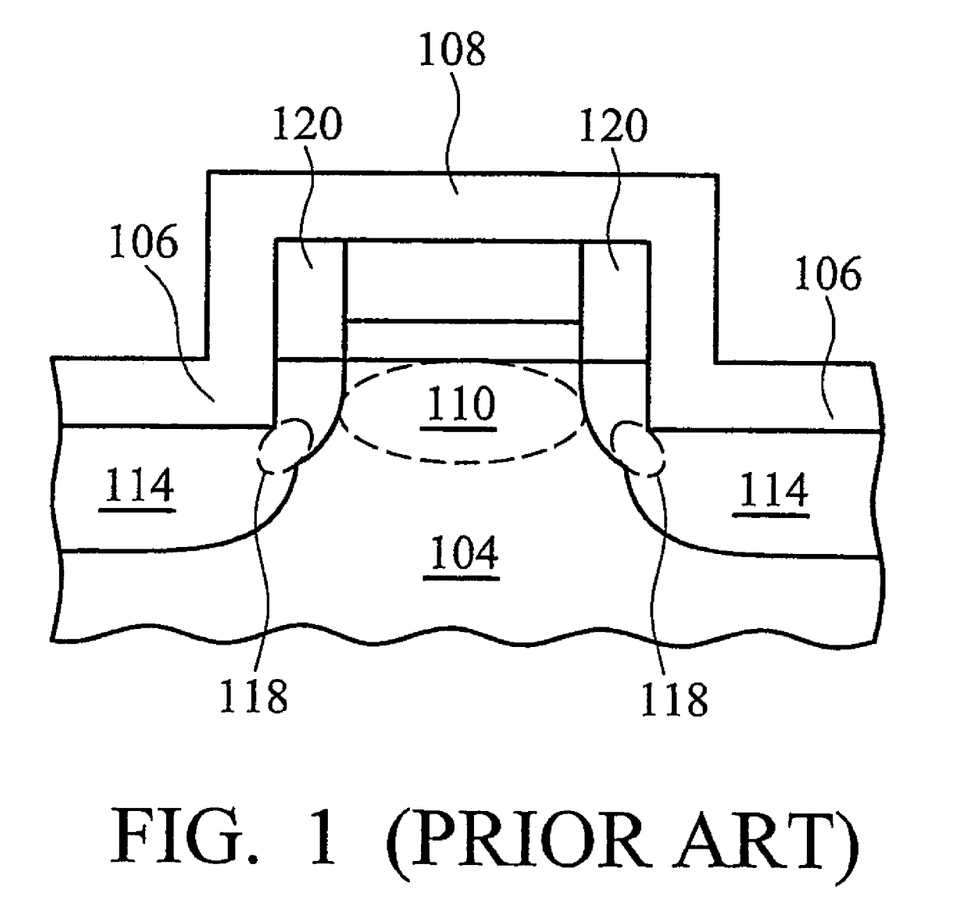
FIG. 1 illustrates a conventional MOS device having recesses in the source/drain regions.

While thick CES layers are desirable for stress engineering, very thick CES layers cause difficulty in subsequent processes, such as inter-layer dielectric (ILD) gap filling, and therefore are undesired in high-density circuit design. Methods to improve the efficiency of applying stress using a CES layer have thus been explored. U.S. Pat. No. 6,870,179 discusses a method for improving stress without the necessity of increasing the thickness of the CES layer. As shown in FIG. 1, after the formation of spacers 120, an extra recessing step is performed on the substrate 104 along edges of spacers 120, forming recesses 106. A stressed CES layer 108 is then formed. Due to recesses 106, the stress applied on channel region 110 by CES layer 108 increases.

Drive current improvement using such a method is significant for large devices. For small devices, however, particularly devices manufactured using 65 nm technologies and beyond, the drive current improvement is less observable, even though the carrier mobility in the channel region is improved. A possible reason is that the recessing of the source/drain regions 114 causes current crowding effects in regions 118, which are substantially narrow, and the device drive current is degraded accordingly. The current crowding effects are particularly severe in small devices having shallow junctions. Additionally, narrow regions 118 cause the leakage current to increase.

What is needed, therefore, is a method that optimizes the stress applied to the channel region while eliminating the detrimental current crowding effects and leakage current, so that device drive currents are improved.

SUMMARY OF THE INVENTION

The preferred embodiments of the present invention provide a structure of a MOS device and a method for forming the same. The MOS device has an optimized stress in the channel region.

In accordance with one aspect of the present invention, the MOS device includes a gate over a substrate, a non-silicide region along an edge of the gate, a source/drain region, and a silicide region on the source/drain region wherein the silicide region has a recess. The recess is spaced apart from a respective edge of the non-silicide region by a spacing. The device further includes a stressed layer substantially over the source/drain region, the non-silicide region and the gate. For an NMOS device, the stressed layer has an inherent tensile stress. For a PMOS device, the stressed layer has an inherent compressive stress.

In accordance with another aspect of the present invention, a step height of the recess and the spacing preferably have a ratio of less than or equal to about 3, and the width of the non-silicide region and the step height have a ratio of less than or equal to about 3.

In accordance with yet another aspect of the present invention, a method for forming the preferred embodiments of the present invention includes forming a gate structure overlying a substrate, forming a gate spacer along an edge of the gate and overlying a portion of the substrate, forming a source/drain region comprising a recess having a recess depth in the substrate, and forming a silicide region on the exposed surface of the source/drain region. A non-silicide region is formed under the gate spacer. The gate spacer may be removed. The recess is spaced apart from a respective edge of the non-silicide region by a spacing. The width of the non-silicide region and the recess depth preferably have a ratio of less than or equal to about 3. The method further includes forming a stressed layer substantially over the gate structure, the source/drain region and the non-silicide region.

By modifying dimensions of the MOS device, the stress in the channel region is optimized, hence device performance is improved.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5 through 13B are cross-sectional views of intermediate stages in the manufacture of a preferred embodiment.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
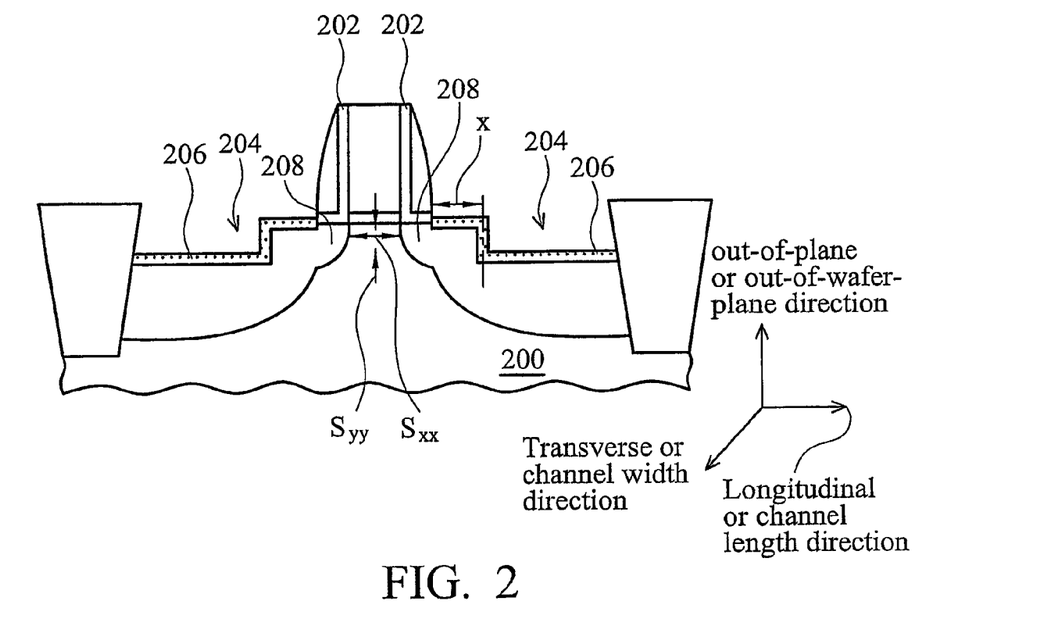
FIG. 2 illustrates a MOS device having reduced current crowding effects.

U.S. patent application Ser. No. 11/181,521, which is herein incorporated by reference, provides an improved structure with recesses in the source/drain regions, as illustrated in FIG. 2. The recesses 204 in the source/drain regions have a spacing X from the respective spacers 202. Due to the spacing X, silicide regions 206 are spaced away from lightly doped drain/source (LDD) regions 208. As a result, current narrowing effects and leakage currents are reduced.

The embodiments discussed in U.S. patent application Ser. No. 11/181,521 provide a good starting structure. Further optimization, however, is needed to maximize the benefit of the improved structure. It is found that the performance of the MOS device embodiment is partially determined by the dimensions and locations of the recesses 204, which affect the magnitude of the stress applied by a subsequently formed contact etch stop layer. Therefore, the relationship between the recesses 204 and stress components in the channel region needs to be studied. For an NMOS device, tensile stresses in channel length (longitudinal) and channel width (transverse) directions and a compressive stress in an out-of-wafer-plane direction (also referred to as out-of-plane direction) are beneficial for the device performance. For a PMOS device, a tensile stress in the channel width direction and the out-of-wafer-plane direction and compressive stresses in the channel length direction are beneficial for the device performance. A summary of the previously discussed relationship between directions and beneficial stresses for respective PMOS and NMOS devices are shown in Table 1, wherein more "+" signs indicate greater beneficial effects on the respective MOS devices from the respective stresses.

TABLE 1

| Direction | NMOS | PMOS |
|---|---|---|
| Longitudinal | Tensile +++ | Compressive ++++ |
| Transverse | Tensile ++ | Tensile +++ |
| Out-of-Plane | Compressive ++++ | Tensile + |

Figure 3:
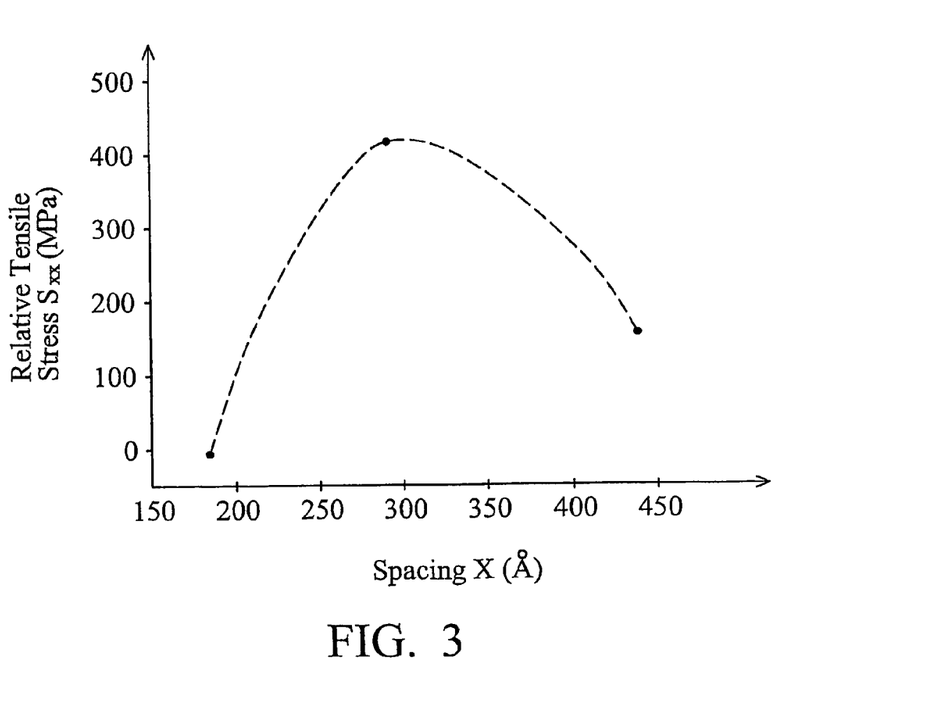
FIGS. 3 and 4 illustrate exemplary simulation results showing stresses in different directions as a function of a spacing between a recess in the source/drain region and a respective gate spacer.
Figure 4:
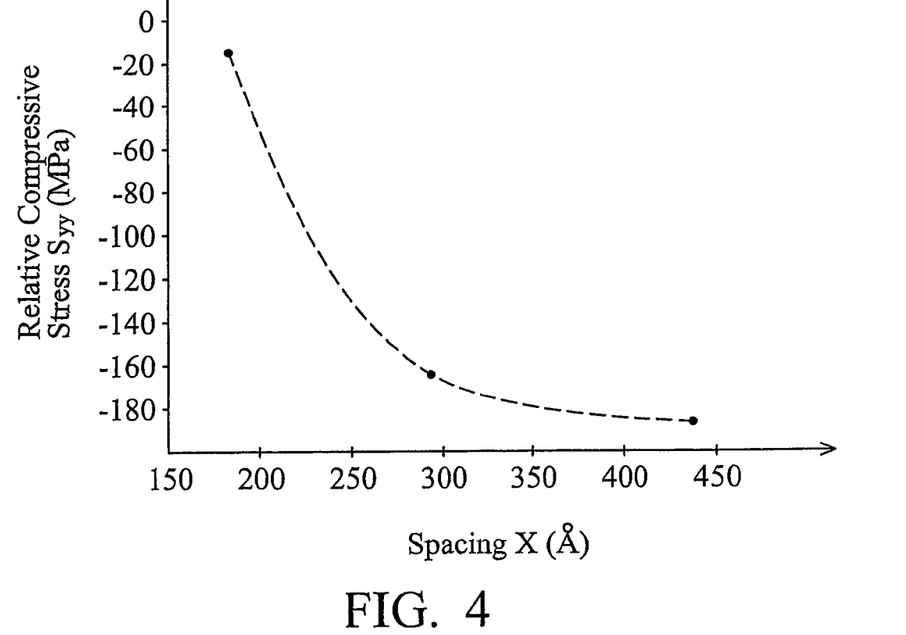

FIGS. 3 and 4 illustrate simulation results regarding the location of recesses 204. FIG. 3 illustrates a relative tensile stress $S_{xx}$ (refer to FIG. 2) in the channel length direction as a function of the spacing X between the recesses 204 and spacers 202, wherein X is from the edge of the spacer to a middle point of the vertical portion of the respective silicide region. Relative tensile stress $S_{xx}$ indicates the difference of the stresses in MOS devices having recesses 204 compared to the stresses in MOS devices having no recesses. The curve illustrated in FIG. 3 shows a surprising result. The relationship between spacing and resulting stress is not linear. When the subsequently formed contact etch stop layer has a tensile stress, the tensile stress in the channel length direction has a greater value when the spacing X is about 300 Å, and has smaller values when the spacing is greater or smaller than 300 Å.

FIG. 4 illustrates a relative compressive stress $S_{yy}$ (refer to FIG. 2) in the out-of-plane direction as a function of the spacing X. Similarly, relative tensile stress $S_{yy}$ indicates the difference of the stresses in MOS devices having recesses 204 compared to the stresses in MOS devices having no recesses. As was the case with FIG. 3, FIG. 4 illustrates an unexpected non-linear relationship. It is found that compressive stress $S_{yy}$ has a greater value when spacing X is about 170 Å and decreases when X increases. For an NMOS device, since it is preferred that both tensile stress in the channel length direction and compressive stress in the out-of-plane direction have greater values, a trade-off has to be made. However, a brief range of the value X, which is preferably between about 170 Å and about 500 Å for this example, can be obtained from the previous analysis.

Exemplary results shown in FIGS. 3 and 4 reveal the importance of the location of the recesses 204. The preferred embodiments of the present invention provide an improved structure of a MOS device having optimized dimensions. The intermediate stages of manufacturing the preferred embodiment of the present invention are illustrated in FIGS. 5 through 12. Throughout the various views and illustrative embodiments of the present invention, like reference numbers are used to designate like elements.

Figure 5:
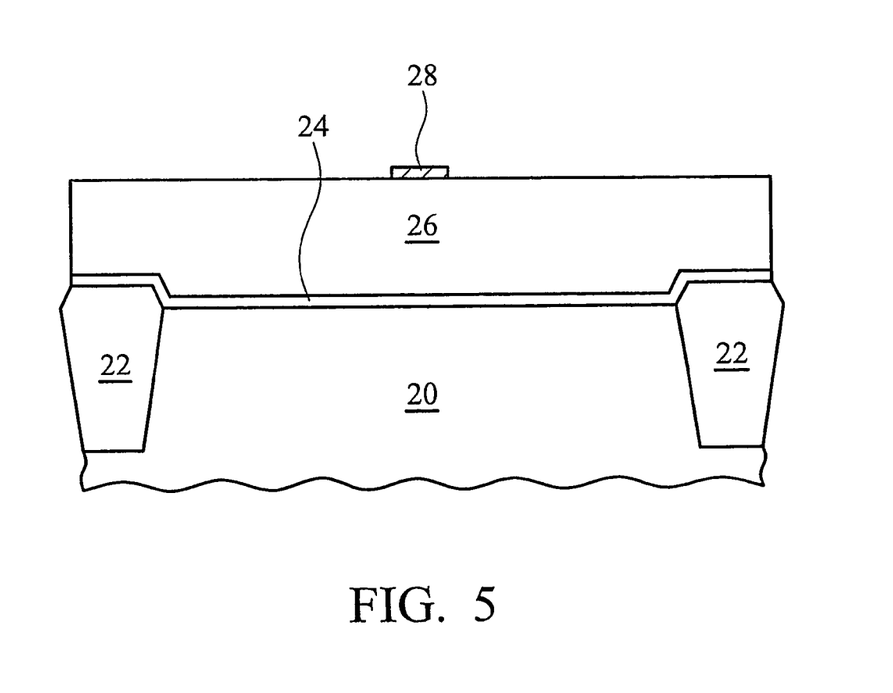

Referring to FIG. 5, a semiconductor substrate 20 is used as a starting material. The semiconductor substrate 20 is preferably a bulk silicon substrate, although other materials such as SiGe can be used. Semiconductor substrate 20 may also comprise other structures such as silicon on insulator (SOI). Isolations regions 22, such as shallow trench isolation regions, are formed in the substrate 20 to provide electrical isolation between active regions in which devices are to be formed. An N-type doped well region or a P-type doped well region (not shown) is preferably formed in the substrate 20 for forming P-channel or N-channel transistors, respectively.

A gate dielectric layer 24 and a gate electrode layer 26 are then formed. The gate dielectric layer 24 may be formed by thermal oxidation, thermal oxidation followed by nitridation, chemical vapor deposition, sputtering, or other techniques known and used in the art. The thickness of the gate dielectric layer 24 preferably ranges from 8 angstroms to 100 angstroms, and more preferably between about 8 angstroms and about 10 angstroms. In the preferred embodiment, the gate dielectric layer 24 comprises a conventional material such as silicon oxide or silicon oxynitride. In other embodiments, high permittivity (high-k) materials such as aluminum oxide $Al_2O_3$, hafnium oxide $HfO_2$, zirconium oxide $ZrO_2$, hafnium oxynitride HfON, hafnium silicate $HfSiO_4$, zirconium silicate $ZrSiO_4$, lanthanum oxide $La_2O_3$ and combinations thereof can be used, and the high-k gate dielectric layer 24 preferably has an equivalent oxide thickness of between about 8 angstroms and about 100 angstroms.

The gate electrode layer 26 may comprise polycrystalline-silicon (poly-Si), poly-crystalline silicon-germanium (poly-SiGe), a refractory metal such as molybdenum, nickel, platinum and tungsten, compounds such as titanium nitride, or other conductive materials. Implants known as work-function implants may be preformed on the gate electrode layer 26, introducing an impurity/impurities to alter the work-function of the subsequently formed gate electrode.

Figure 6:
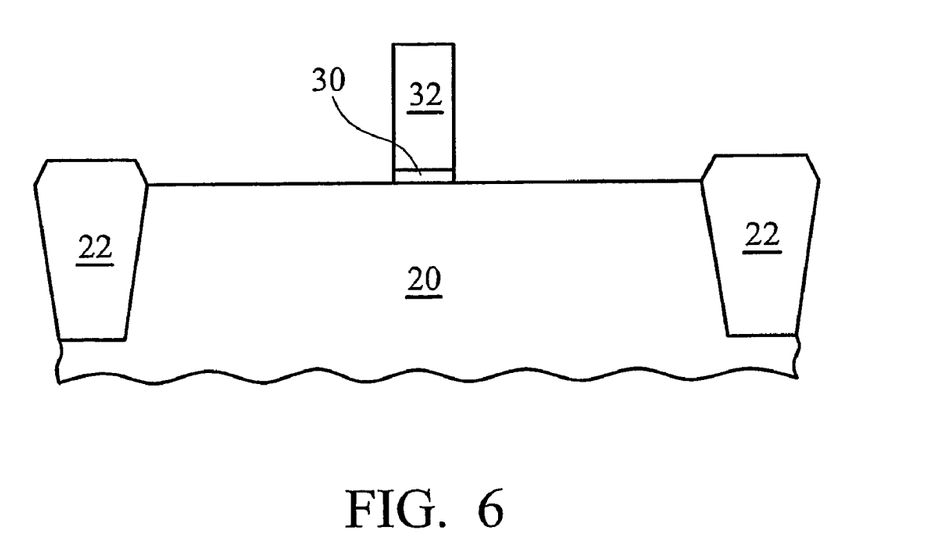

A gate mask layer is deposited over the gate electrode layer 26 and then patterned, forming a gate mask 28, which is used for defining a gate electrode. The underlying gate electrode layer 26 is then patterned to form a gate electrode 32, as shown in FIG. 6. In the preferred embodiment wherein gate electrode layer 26 comprises polysilicon and gate dielectric layer 24 comprises silicon oxynitride, a plasma etch using chlorine and bromine chemistry is preferably performed to etch the gate electrode layer 26, so that the etching has a high selectivity with respect to the gate dielectric layer 24. The gate dielectric layer 24 is also patterned, forming the gate dielectric 30. After the definition of the gate electrode 32 and the gate dielectric 30, gate mask 28 is removed.

Figure 7:
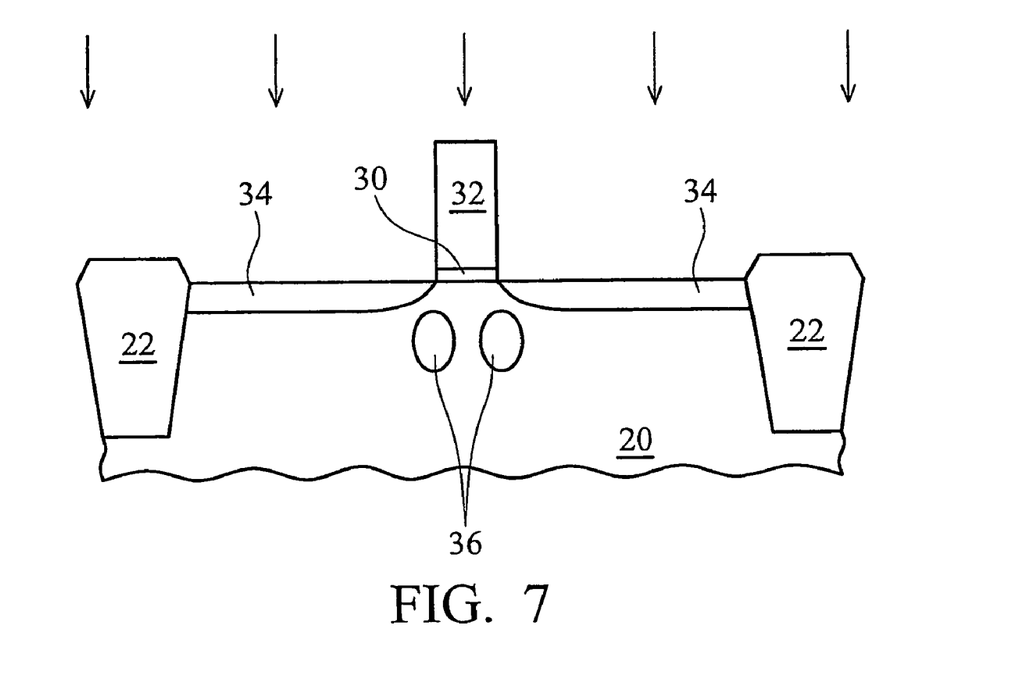

FIG. 7 illustrates the formation of first source/drain extension regions 34, also referred to as first lightly doped drain/source (LDD) regions 34, and first pocket regions 36. Both regions may be formed by ion implantation, plasma immersion ion implantation (PIII), or other techniques as are known and used in the art. Preferably, the pocket regions 36 comprise an impurity of an opposite conductivity type of the first source/drain extension regions 34, and are formed under and substantially close to the bottom border of the first source/drain extension regions 34. It is understood by one skilled in the art that although the first pocket regions 36 are shown as substantially under the gate electrode 32, they can extend further toward the isolation regions 22 on the respective side.

Figure 8:
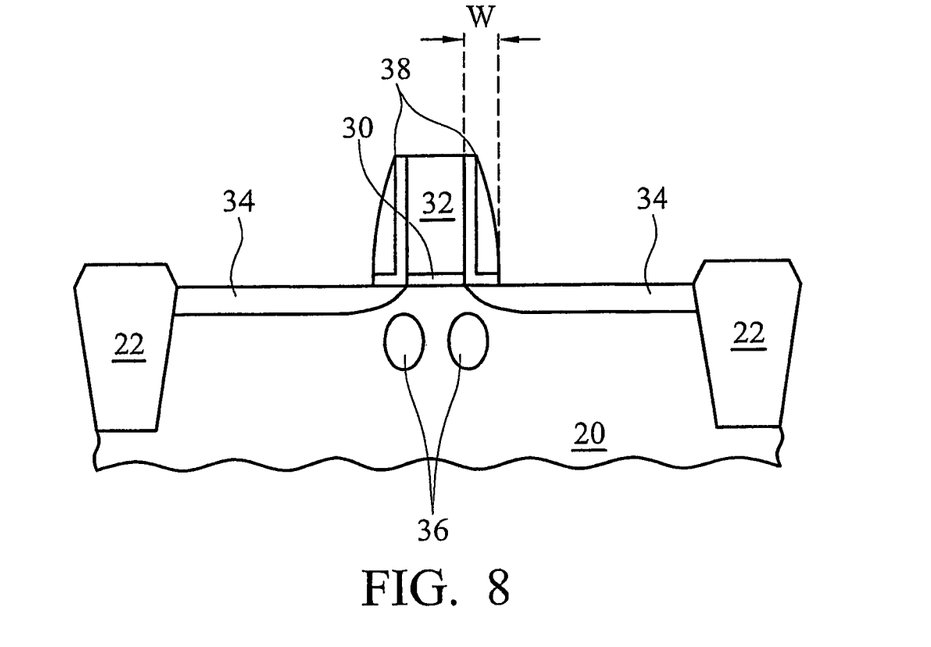

Referring to FIG. 8, first spacers 38 are formed on the sidewalls of the gate electrode 32 and gate dielectric 30, preferably by depositing spacer layers and selectively etching the spacer layers. In the preferred embodiment, each of the spacers 38 comprises a silicon nitride portion on a silicon oxide portion. In alternative embodiments, first spacers 38 comprise a single layer such as a silicon nitride layer. The first spacers 38 preferably have a width W of between about 100 Å and about 300 Å.

Figure 9:
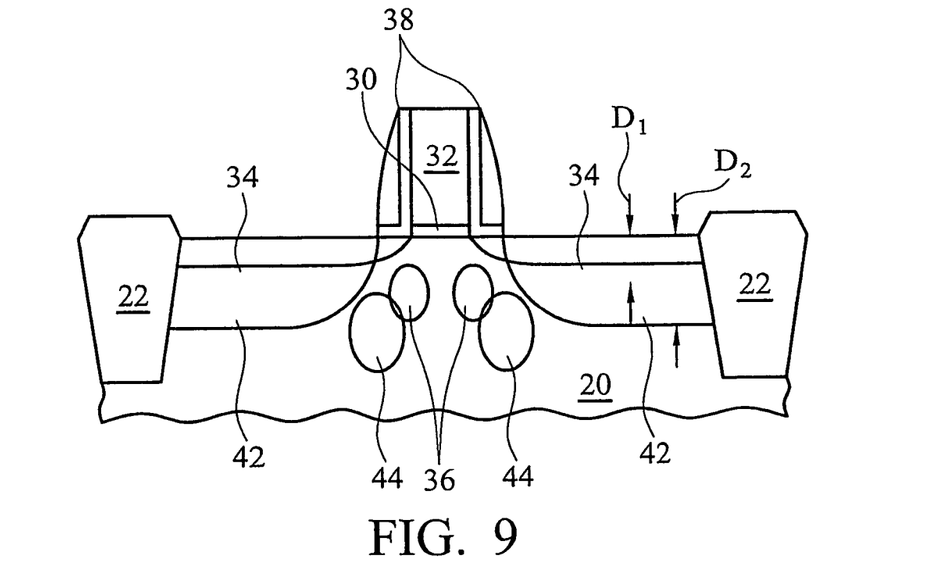

Second source/drain extension regions 42 and second pocket regions 44 are then formed, as shown in FIG. 9. Preferably, second source/drain extension regions 42 are of a same conductivity type as the first source/drain extension regions 34. Similarly, second pocket regions 44 are of a same conductivity type as the first pocket regions 36. Second pocket regions 44 are preferably under and substantially close to a bottom border of the second source/drain extension regions 42, which have a depth $D_2$ greater than the depth $D_1$ of the first second source/drain extension regions 34. Accordingly, the second pocket regions 44 are formed deeper than the first source/drain extension regions 42.

Figure 10:
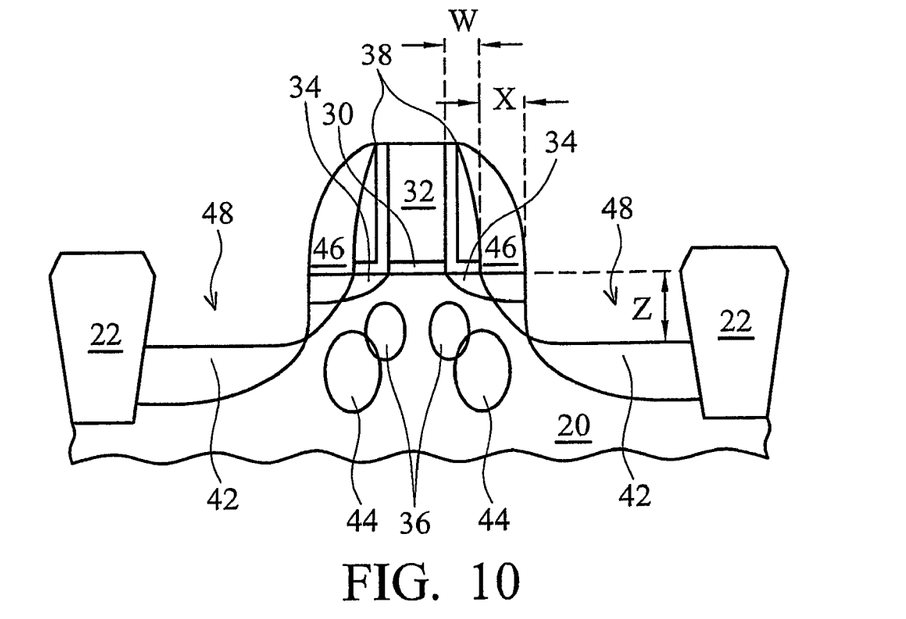

FIG. 10 illustrates the formation of second spacers 46, which preferably have a width X of between about 10 nm and about 100 nm, and more preferably between about 20 nm and about 50 nm. Second spacers 46 preferably have different etching characteristics than (the outer portions of) first spacers 38 for the convenience of the subsequent removal step, although the same material can be used.

Recesses 48 with a depth Z are then formed, preferably substantially aligned with side edges of the second spacers 46, and preferably by plasma etch using chlorine and bromine chemistry. The depth Z of the recesses 48 is preferably greater than about 20 nm. An optional anneal may be performed, facilitating silicon migration to repair any etch damage as well as to smooth the substrate surface.

Figure 11:
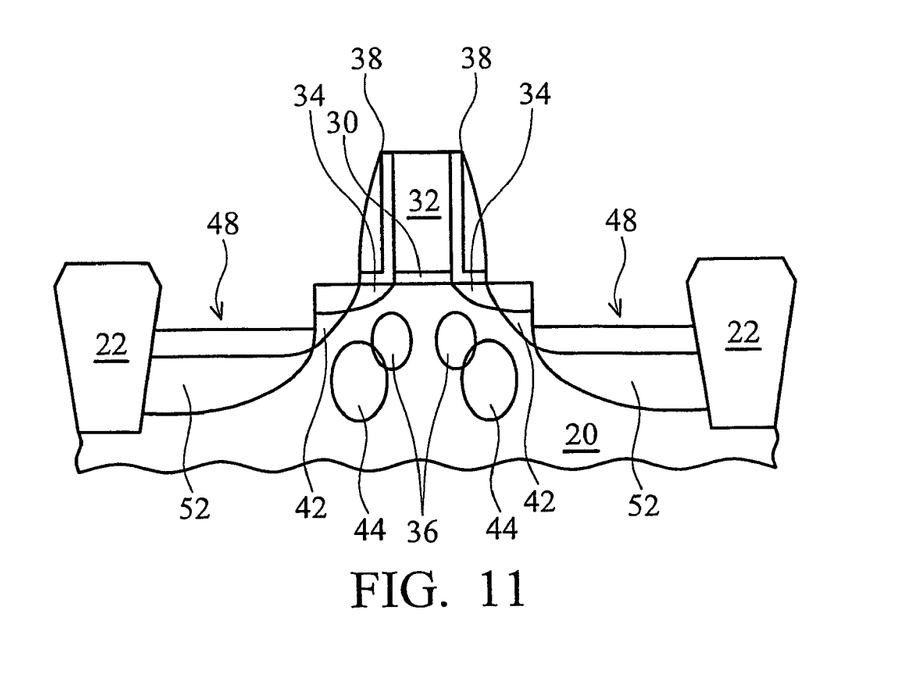

Next, deep source/drain regions 52 are formed, as shown in FIG. 11. The dopants in the deep source/drain regions 52 may be introduced by ion implantation, PIII, gas or solid source diffusion, or any other techniques known in the art. Any implant damage or amorphization can be annealed through subsequent exposure to elevated temperatures. After source/drain implantation, the second spacers 46 are removed.

Figure 12:
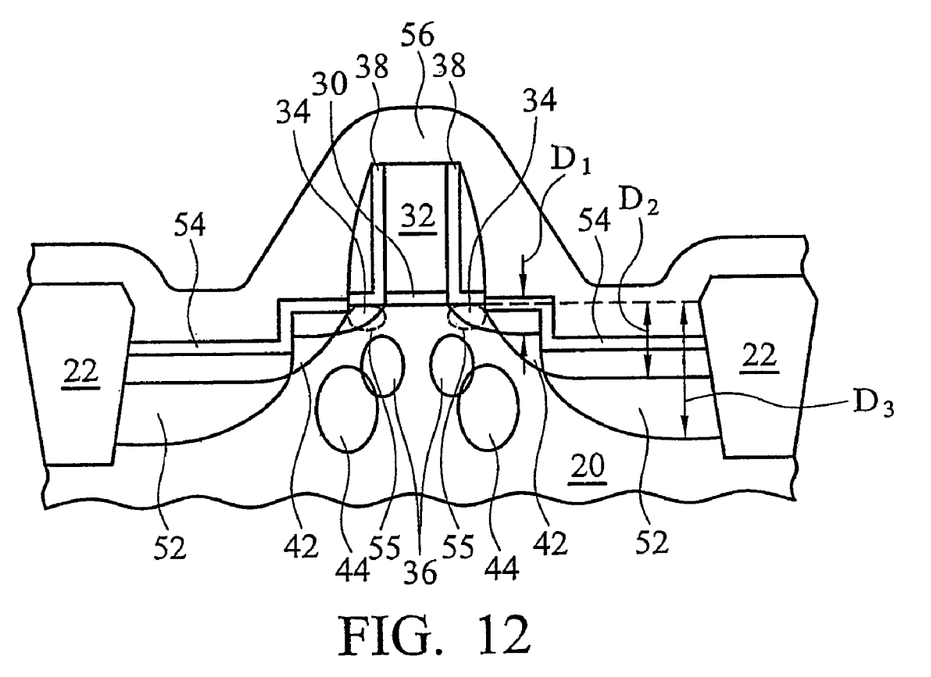

FIG. 12 illustrates the formation of conductive regions 54, sometimes referred to as silicide regions 54, and a stressed layer 56. As is known in the art, the resistance of the source/drain regions can be reduced by strapping the source/drain regions with a conductive material. Preferably, the conductive material comprises metals such as nickel, erbium, platinum, and the like, and is formed using a self-aligned silicide, also known as a salicide process, or other metal deposition process. Due to the masking of the gate spacers 38, non-silicide regions 55 are formed in the substrate 20 and between the edge of the gate 32 and the silicide region 54, wherein the edges 57 (see FIG. 13A) of the non-silicide region 55 interface the respective silicide regions 54. After the formation of the silicide regions 54, the gate spacer 38 may be removed (partially or entirely) for additional stress migration into the channel followed by a subsequent CES layer formation. Each of silicide regions 54 includes a higher portion 62, and a lower portion 64, wherein each of the higher portion 62 and lower portion 64 my be substantially flat with a substantilly uniform thichness.

From FIG. 12, it can be found that by controlling the depths of the first and second source/drain extension regions 34 and 42 and deep source/drain regions 52, current-narrowing effects can be effectively reduced. It is preferred that the depth $D_2$ of the second source/drain extension regions 42 be between about one and about two times the recess depth Z, while the first source/drain extension regions preferably have a depth $D_1$ of less than or equal to about 80 percent of the recess depth Z. Deep source/drain regions 52, on the other hand, preferably have a depth $D_3$ greater than $D_2$, and more preferably between about one and one half times and about five times the recess depth Z.

Figure 13A:
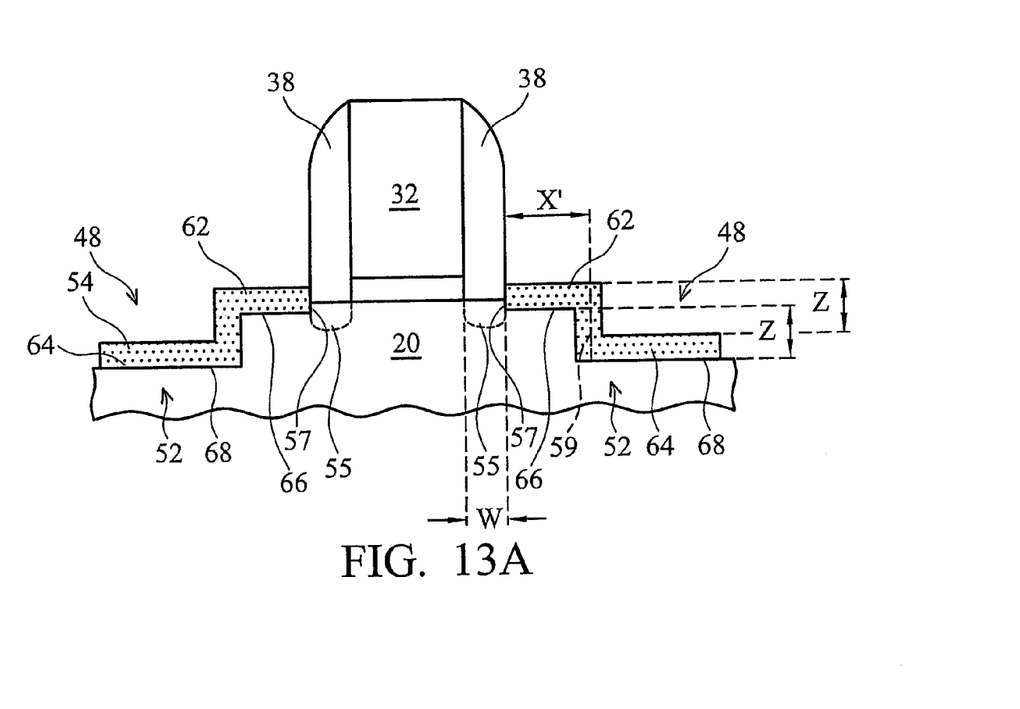

In order to have a clearer view, a portion of FIG. 12 is schematically illustrated in FIG. 13A, wherein components not discussed are not shown. Note that higher portions 62 of silicide regions 54 and lower portions 64 have a step height substantially equaling the depth Z of the recesses 48. Accordingly, the top surfaces of the respective source/drain regions have higher portions 66 and lower portions 68 with a step height substantially equaling the recess depth Z. If a horizontal distance between an edge 57 of a non-silicide region 55 and a middle point 59 of a vertical portion of the respective silicide region 54 is referred to as a spacing X', one skilled in the art will realize that for MOS devices with different scales, the optimum spacing X' and the step height Z may be different. Relative values are thus suitable for specifying preferred dimensions. In the preferred embodiment, a ratio of step height Z to spacing X' is preferably less than or equal to about 3, and more preferably between about 0.2 and about 2. A width W of the non-silicide regions 55 and the step height Z preferably have a ratio of less than or equal to about 3, and more preferably between about 0.5 and about 2.

Figure 13B:
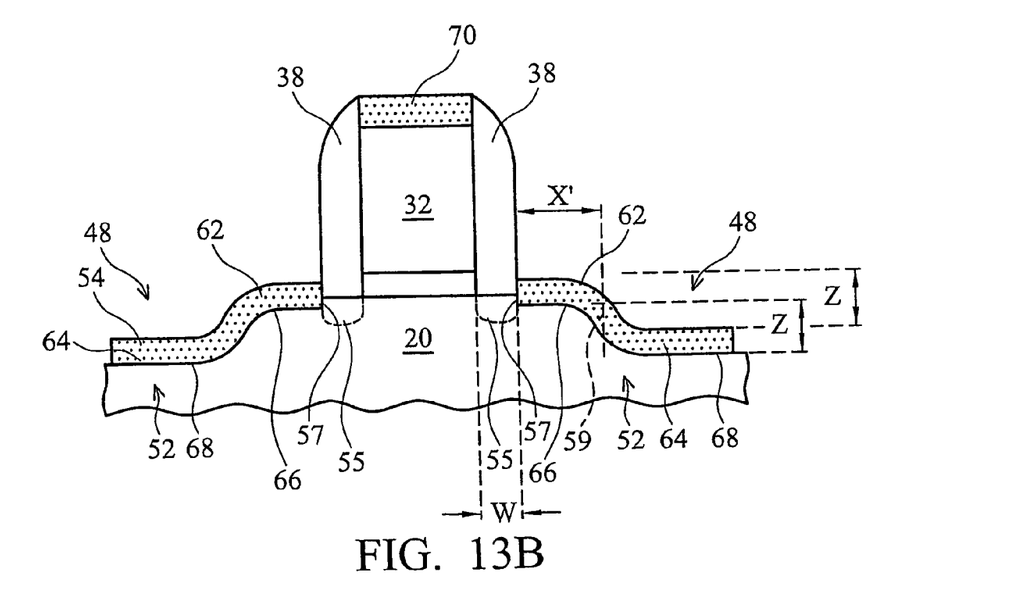

In practical cases, as shown in FIG. 13B, silicide regions 54 often have curved shapes instead of sharp angles as shown in FIG. 13A. However, the principles taught through the preferred embodiments of the present invention still hold true. In such cases, the preferred dimensions and ratios may be determined, for example, by approximating the curves in FIG. 13B to sharp angles in FIG. 13A using the middle point 59 as a reference. It should be appreciated that silicide region 70 may also be formed on top of the gate electrode 32.

FIG. 12 also illustrates the formation of a high-stress film 56, which preferably comprises silicon nitride or other high-stress materials. The stress may be compressive or tensile in nature and may have a magnitude in the range of about 0.1 to about 4 giga-pascals (GPa). The high-stress film 56 is preferably formed by a chemical vapor deposition (CVD) process, such as a low-pressure CVD (LPCVD) process or a plasma-enhanced CVD (PECVD) process, as is commonly known and used in the art. The high-stress film 56 is preferably a contact etch stop layer (CESL), although it can be a layer not performing an etch stop function or a composite layer comprising a CESL and other layers. Metallization and passivation layers are then formed to complete the device.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a substrate;
    a gate over the substrate;
    a channel region in the substrate and directly underlying the gate;
    a non-silicide region of the substrate not directly underlying the gate, wherein the non-silicide region adjoins the channel region;
    a source/drain region comprising a recess in the substrate, wherein the source/drain region comprises:
        a first source/drain extension region;
        a second source/drain extension region further from the gate than the first source/drain extension region; and
        a deep source/drain region further from the gate than the second source/drain extension region; and
    a silicide region on the source/drain region, wherein the silicide region has a top surface comprising a lower portion, and a higher portion between the lower portion and the non-silicide region, the lower portion having a top surface lower than a top surface of the higher portion by a step height, wherein a width of the non-silicide region and the step height have a ratio of less than or equal to about 3.

2. The semiconductor structure of claim 1, wherein the width of the non-silicide region and the step height have a ratio of between about 0.5 and about 2.

3. The semiconductor structure of claim 1, wherein the step height is greater than about 20 nm.

4. The semiconductor structure of claim 1, wherein the lower portion of the top surface of the silicide region has a spacing from a respective edge of the non-silicide region, and wherein the step height and the spacing have a ratio of less than or equal to about 3.

5. The semiconductor structure of claim 4, wherein the width of the non-silicide region is between about 10 nm and about 100 nm.

6. The semiconductor structure of claim 1, wherein the first source/drain extension region has a first depth, and wherein the first depth and the step height have a ratio of less than or equal to about 0.8.

7. The semiconductor structure of claim 1, wherein the second source/drain extension region has a second depth, and wherein the second depth and the step height have a ratio of between about 1 and about 2.

8. The semiconductor structure of claim 1, wherein the deep source/drain region has a third depth, and wherein the third depth and the step height have a ratio of between about 1.5 and about 5.

9. The semiconductor structure of claim 1 further comprising a tensile-stressed layer over the gate, the non-silicide region, and the source/drain region, wherein the tensile-stressed layer contacts the lower portion of the top surface of the silicide region.

10. The semiconductor structure of claim 1, wherein the higher portion of the top surface of the silicide region is substantially flat with a respective portion of the silicide region having a substantially uniform thickness, and wherein the silicide region further comprises a substantially vertical portion between and adjoining the higher portion and the lower portion.

11. A semiconductor structure comprising:
    a substrate;
    a gate over the substrate;
    a non-silicide region of the substrate adjacent the gate;
    a source/drain region comprising:
        a recess in the substrate;
        a first source/drain extension region;
        a second source/drain extension region further from the gate than the first source/drain extension region; and
        a deep source/drain region having a depth; and
    a silicide region on the source/drain region, wherein the silicide region has a top surface comprising:
        a lower portion; and
        a higher portion between the lower portion and the non-silicide region, the lower portion having a top surface lower than a top surface of the higher portion by a step height, wherein a width of the non-silicide region and the step height have a ratio of less than or equal to about 3, and wherein the depth and the step height have a ratio of between about 1.5 and about 5.

12. The semiconductor structure of claim 11, wherein the higher portion of the top surface of the silicide region is substantially flat with a respective portion of the silicide region having a substantially uniform thickness, and wherein the silicide region further comprises a substantially vertical portion between and adjoining the higher portion and the lower portion.

13. The semiconductor structure of claim 11, wherein the deep source/drain region is further from the gate than the second source/drain extension region.

14. The semiconductor structure of claim 11, further comprising a tensile-stressed layer over the gate, the non-silicide region, and the source/drain region, wherein the tensile-stressed layer contacts a portion of the lower portion of the top surface of the silicide region.

* * * * *